(12) United States Patent
Kim et al.

(10) Patent No.: US 6,531,348 B2
(45) Date of Patent: Mar. 11, 2003

(54) METHOD FOR CRYSTALLIZING AMORPHOUS SILICON AND FABRICATING THIN FILM TRANSISTOR USING CRYSTALLIZED SILICON

(75) Inventors: Hae-Yeol Kim, Gyeonggi-do (KR); Jong-Il Kim, Seoul (KR); Se-June Kim, Seoul (KR)

(73) Assignee: LG.Philips LCD Co., LTD, Seoul (KR)

( * ) Notice: Subject to any disclaimer, the term of this patent is extended or adjusted under 35 U.S.C. 154(b) by 0 days.

(21) Appl. No.: 10/000,092

(22) Filed: Dec. 4, 2001

(65) Prior Publication Data

US 2002/0086470 A1 Jul. 4, 2002

(30) Foreign Application Priority Data

Dec. 29, 2000 (KR) .......................... 2000-86333

(51) Int. Cl.⁷ .............................................. H01L 21/00
(52) U.S. Cl. ....................................... 438/166; 438/486
(58) Field of Search .................................. 438/166, 486

(56) References Cited

U.S. PATENT DOCUMENTS

| | | | | |
|---|---|---|---|---|
| 5,096,880 | A | * | 3/1992 | Rybka |
| 5,498,904 | A | * | 3/1996 | Harata et al. |
| 5,956,581 | A | * | 9/1999 | Yamazaki et al. |
| 6,326,226 | B1 | * | 1/2001 | Jang et al. |
| 6,309,951 | B1 | * | 10/2001 | Jang et al. |
| 6,383,852 | B2 | * | 5/2002 | Zhang et al. |

FOREIGN PATENT DOCUMENTS

KR   2001054935 A   *   7/2001

* cited by examiner

*Primary Examiner*—John F. Niebling
*Assistant Examiner*—Stanetta Isaac
(74) *Attorney, Agent, or Firm*—Morgan, Lewis & Bockius LLP

(57) ABSTRACT

A method of crystallizing amorphous silicon includes forming an amorphous silicon layer over a substrate, forming a plurality of metal clusters on the amorphous silicon layer, and simultaneously applying a thermal treatment, an electric field, and a magnetic field to crystallize the amorphous silicon layer.

19 Claims, 5 Drawing Sheets

METHOD FOR CRYSTALLIZING AMORPHOUS SILICON AND FABRICATING THIN FILM TRANSISTOR USING CRYSTALLIZED SILICON

This application claims the benefit of Korean Application No. P2000-86333 filed on Dec. 29, 2000, which is hereby incorporated by reference.

BACKGROUND OF THE INVENTION

1. Field of the Invention

The present invention relates to a method for crystallizing amorphous silicon, and more particularly, to method for crystallizing amorphous silicon and fabricating a thin film transistor using the crystallized silicon.

2. Discussion of the Related Art

Due to a rapid development in information technologies, display devices are developed in accordance with the pace of the technology development. Display devices process and display a great deal of information. A cathode ray tube (CRT) has served as a mainstream of the display devices. To meet the needs of the current technology break-through, a flat panel display device having small size, light weight, and low power consumption is a more important area in research.

In general, liquid crystal display (LCD) devices make use of optical anisotropy and polarization characteristics of liquid crystal molecules to control an arrangement in orientation. The arrangement direction of the liquid crystal molecules can be controlled by applying an electric field. Accordingly, when the electric field is applied to the liquid crystal molecules, the arrangement of the liquid crystal molecules changes. Since refraction of incident light is determined by the arrangement of the liquid crystal molecules, display of image data can be controlled by changing the electric field applied to the liquid crystal molecules.

As an active layer of a thin film transistor (TFT) in an array substrate for use in liquid crystal display (LCD) devices, amorphous silicon (a-Si) is widely used. This is because amorphous silicon can be formed on the low cost glass substrate at a low temperature in fabricating a large LCD panel. However, a driving circuit is required to drive the thin film transistors including amorphous silicon.

As well known, the liquid crystal display device includes an array substrate, and the array substrate is electrically connected to large scale integrated circuit (LSIC) fabricated by the single crystal silicon, using a tape automated bonding (TAB) method. The driving circuit, however, is very expensive, and thus the liquid crystal display including the large scale integration costs also high.

Accordingly, the thin film transistor (TFT) formed of polycrystalline silicon (poly-Si) for fabricating a liquid crystal display device has been researched and developed. In the liquid crystal display device employing poly-Si in a thin film transistor, the thin film transistor and the driving circuit can be formed on the same substrate. Thus, it is not necessary for the driving circuit to be connected to the thin film transistor. Further, it is easy to obtain a fast response time in display when using the polycrystalline silicon as an element of the TFT rather than the amorphous silicon as an element of the TFT. Namely, a field effect mobility in poly-Si is 100 to 200 times faster than that in a-Si. Additionally, the poly-Si has a good stability against light and temperature variations.

In the view of the foregoing, various methods for forming the poly-Si are well known. Of the different types of methods for forming poly-Si, a method for crystallizing a-Si after depositing a-Si using plasma enhanced chemical vapor deposition (PECVD) or low pressure chemical vapor deposition (LPCVD) is widely known and employed in the crystallization of a-Si. Furthermore, as a method for forming poly-Si from a-Si, for example, a solid phase crystallization (SPC), an excimer laser crystallization (ELC) or a metal induced crystallization (MIC) has been employed.

In the process of the solid phase crystallization (SPC), amorphous silicon is exposed to heat approaching about 600 degrees celsius for at least several hours. Namely, the solid phase crystallization (SPC) is to change amorphous silicon into polycrystalline silicon by a heat-treatment at a high temperature for a long time in a furnace. It requires forming a buffer layer on the quartz substrate having a thermal endurance over temperatures of 600 degrees celsius (° C.) in order to prevent the quartz substrate from diffusing out impurities. The amorphous silicon layer is deposited on the buffer layer and introduced by the heat-treatment.

The solid phase crystallization (SPC) method, however, results in an irregular grain growth and irregular grain boundaries so that the gate insulating layer on the polycrystalline silicon layer grows erratically, thereby lowering breakdown voltage of the device. In addition, since the grain sizes of the polycrystalline silicon are excessively non-uniform, electrical characteristics, such as current and a threshold voltage, are not good. Further, a costly quartz substrate should be employed.

The excimer laser crystallization (ELC) process has also been used with some advantages in annealing amorphous silicon. Laser allows areas of the amorphous film to be exposed to very high temperatures for very short periods of time. Theoretically, this offers a possibility of annealing the amorphous silicon at an optimum temperature (less than 400 degrees celsius) without degrading the transparent substrate upon which it is mounted. However, use of this method has been limited by the lack of control over some of the process steps. Typically, an aperture size of the laser is relatively small. The aperture size, power of the laser, and a thickness of the film may require multiple laser passes, or shots, to complete an annealing process. Since it is difficult to precisely control the laser, the multiple shots introduce non-uniformities into the annealing process. Further, the substrates must be annealed serially, instead of in a furnace. TFTs made by this method are significantly more expensive than those made by direct deposition or SPC.

A metal induced crystallization is another example of a method for crystallizing amorphous silicon at a low temperature. In the metal induced crystallization, metal, such as nickel (Ni), is disposed on the amorphous silicon layer, and then lowers the crystallization temperature of the amorphous silicon.

For a better understanding of the metal induced crystallization (MIC) method, detailed descriptions are made with reference to the accompanying drawings as follows.

FIGS. 1A to 1C are perspective views showing crystallization steps of an amorphous silicon layer using a field effect metal induced crystallization (FEMIC) method according to a related art.

Referring to FIG. 1A, a buffer layer 2 is formed on a substrate 1, and then an amorphous silicon layer 4 is formed on the buffer layer 2. The buffer layer 2 is generally formed of silicon oxide ($SiO_2$) and protect the amorphous silicon layer 4 from the alkali substances. In FIG. 1A, metal clusters 8, such as nickel (Ni), paladium (Pd), iron (Fe), and cobalt (Co), is deposited on the entire surface of the amorphous silicon layer 4 by evaporation, sputtering, CVD or using a metal solution. This metal is called a metal catalyst and heated by a high density voltage.

FIG. 1B shows a step of crystallizing the amorphous silicon layer 4. As shown, a pair of electrodes 10 are disposed at both sides of the amorphous silicon layer 4 including the metal clusters 8 thereon. Thereafter, a direct current having a high voltage is supplied to the electrodes 10. While applying the direct current having high voltage to the electrodes 10, the substrate 1 is then subjected to a thermal treatment with a temperature of approximately 500 degrees celsius (° C.). As a result, a polycrystalline silicon layer 5 of FIG. 1C is formed over the substrate 1.

During the above-mentioned field enhanced metal induced crystallization (FEMIC) method, the metal catalyst such as nickel (Ni) on the amorphous silicon layer 4 begins to react with the amorphous silicon at a temperature of about 200 degrees celsius (° C.), and then is converted into silicide. At the beginning of the reaction, nickel can be easily silicified by heating at about 200 degrees celsius (° C.), thereby forming $Ni_2Si$. As the temperature increases, nickel (Ni) becomes nickel monosilicide (NiSi), and finally formed as nickel disilicide ($NiSi_2$). The final phase, nickel disilicide ($NiSi_2$), is the most stable state. As a result, the amorphous silicon is crystallized into polycrystalline silicon (poly-Si) at a temperature of about 500 degrees celsius (° C.) because nickel disilicide ($NiSi_2$) acts as seeds in crystallization. When crystallizing the amorphous silicon layer 4, if the voltage is applied to the electrodes 10, the crystallization of amorphous silicon is enhanced because a diffusion rate and a mobility of nickel disilicide ($NiSi_2$) are promoted. Thus, the poly-Si layer can be formed at a low temperature for a relatively short time.

However, there are some problems in the conventional field enhanced metal induced crystallization (FEMIC) method. An infinitesimal quantity of metal catalyst is required to prevent the metal catalyst from remaining in the polycrystalline silicon layer. The residual metal catalyst causes a deterioration of the polycrystalline silicon layer. Further, the metal and amorphous silicon are oxidized during the crystallization. Namely, the metal is combined with oxygen and the surface of the amorphous silicon layer is oxidized, thereby decreasing a crystallization rate of the amorphous silicon.

Furthermore, during the crystallization processes, heat loss occurs in the entire surface of the amorphous silicon layer. Therefore, the crystallized polysilicon at a temperature of about 500 degrees celsius (° C.) has irregular or non-uniform grains after crystallization. That is due to an irregular temperature distribution in the amorphous silicon layer.

SUMMARY OF THE INVENTION

Accordingly, the present invention is directed to a method for crystallizing an amorphous silicon and fabricating a thin film transistor using crystallized silicon that substantially obviates one or more of problems due to limitations and disadvantages of the related art.

Another object of the present invention is to provide a method for crystallizing an amorphous silicon layer by enhancing a crystallization rate.

Another object of the present invention is to provide a method for crystallizing an amorphous silicon layer at a relatively low temperature.

A further object of the present invention is to provide a method for crystallizing an amorphous silicon layer having uniform grains.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for crystallizing amorphous silicon includes forming an amorphous silicon layer over a substrate, forming a plurality of metal clusters the amorphous silicon layer, and simultaneously applying a thermal treatment, an electric field, and a magnetic field to crystallize the amorphous silicon layer.

The method for crystallizing amorphous silicon further includes forming a buffer layer between the substrate and the amorphous silicon layer. Here, the buffer layer is formed of silicon oxide ($SiO_2$)

The above-mentioned the amorphous silicon layer is crystallized at a temperature of about 450 degrees celsius (° C.)

In the method for crystallizing amorphous silicon, the magnetic field may be applied to a direction facilitating a movement of atoms of the metal clusters. The metal clusters are metal selected from a group consisting of nickel (Ni), paladium (Pd), iron (Fe), and cobalt (Co).

In another aspect of the present invention, a method for forming a thin film transistor includes forming a buffer layer on a substrate, forming an amorphous silicon layer on the buffer layer, forming a plurality of metal clusters on the amorphous silicon film, simultaneously applying a thermal treatment, an electric field, and a magnetic field to crystallize the amorphous silicon layer into a polycrystalline silicon layer, patterning the polycrystalline silicon layer to form an island shape, forming a gate insulating layer on the island-shaped polycrystalline silicon, layer, forming a gate electrode on the gate insulation layer, forming an active region, a source region, and a drain region in the island-shaped polycrystalline silicon layer, forming an interlayer insulating layer on the gate electrode and the island-shaped polycrystalline silicon layer including the buffer layer, patterning the interlayer insulating layer to form a source contact hole at the source region and a drain contact hole at the drain region, and simultaneously forming a source electrode contacting the source region through the source contact hole and a drain electrode contacting the drain region through the drain contact hole.

The above-mentioned dopant includes a group III element, such as boron (B), or a group V element, such as phosphorous (P).

In the method for forming the thin film transistor, the thermal treatment is performed at a temperature of about 450 degrees celsius (° C.). Further, the magnetic field is applied to a direction facilitating a movement of atoms of the metal clusters.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

FIGS. 2A to 2D are perspective views showing crystallization steps of an amorphous silicon layer according to a first embodiment of the present invention.

Figure 1A:
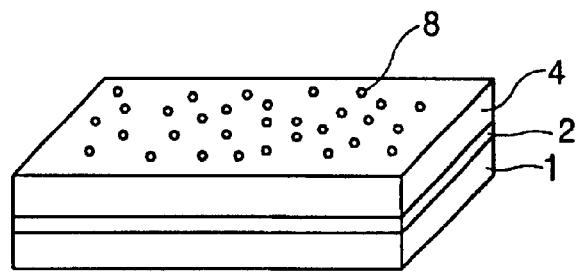
FIGS. 1A to 1C are perspective views showing crystallization steps of an amorphous silicon layer according to a related art.
Figure 1B:
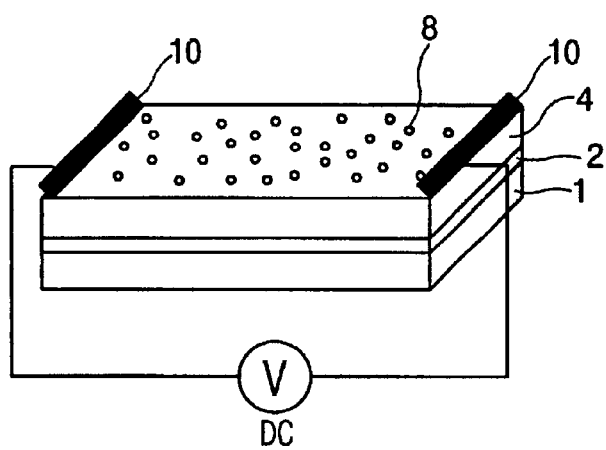
Figure 1C:
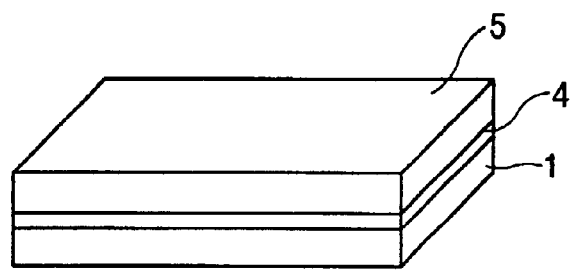
Figure 2A:
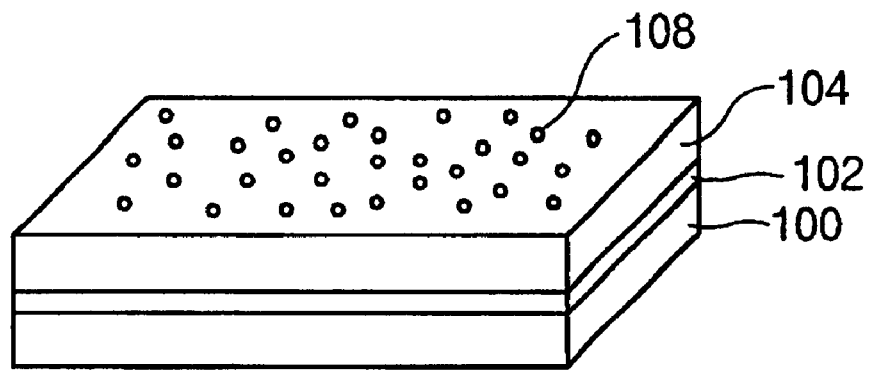
FIGS. 2A to 2D are perspective views showing crystallization steps of an amorphous silicon layer according to the present invention.

Referring to FIG. 2A, a buffer layer 102 is formed on a substrate 100, and then an amorphous silicon layer 104 is formed on the buffer layer 102. The buffer layer 102 on the substrate 100 prevents an impurity diffusion from the substrate 100 into the amorphous silicon layer 104. In this present invention, silicon oxide ($SiO_2$) may be selected as the buffer layer 102. Thereafter, a very small amount of catalytic metal clusters 108, such as nickel (Ni), is deposited on the entire surface of the amorphous silicon layer 104 by using evaporation, sputtering, chemical vapor deposition (CVD) or a metal solution. The catalytic metal clusters 108 may be formed to have a density of about $5 \times 10^{13}$ to $1 \times 10^{19}/cm^2$. For the catalytic metal clusters 108, such as nickel (Ni), paladium (Pd), iron (Fe), and cobalt (Co) that are ferromagnetic may be selected. As amorphous silicon is in contact with the catalytic metal clusters 108, a crystallization temperature is lowered. For example, in a nickel-induced crystallization, a final nickel silicide phase, such as nickel disilicide ($NiSi_2$), acts as a crystal seed that promotes a polycrystalline silicon growth rate. Nickel disilicide ($NiSi_2$) has a silicon-like structure with a lattice constant of 5.405 angstroms (Å), approximate to that of silicon (5.430 angstroms (Å)), and accelerates the transformation of amorphous silicon into polycrystalline silicon.

Figure 2B:
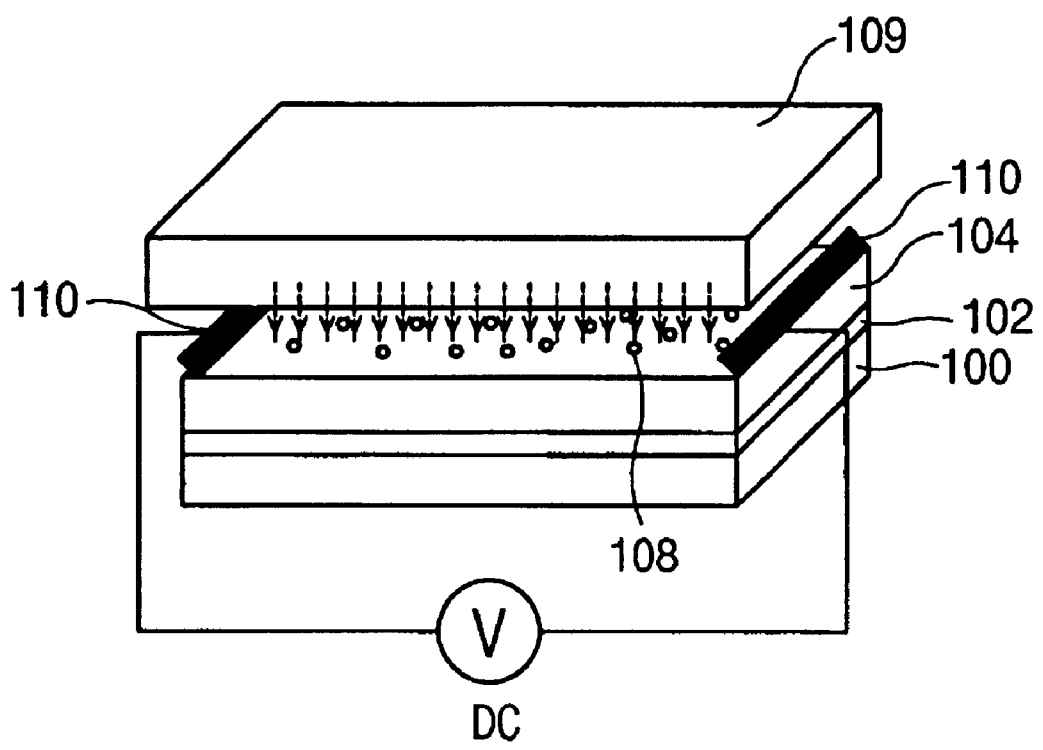

Now, referring to FIG. 2B, a pair of electrodes 110 are disposed on the amorphous silicon layer 104 in order to accelerate the crystallization of amorphous silicon by way of applying a voltage. Either a DC or AC voltage may be applied for this purpose. For example, about 10 to 500 V/cm may be applied in the present invention. Further, a magnetic field generator 109 is disposed over the substrate 100 having the amorphous silicon layer 104. The substrate 110 having the above-mentioned elements is then subjected to a thermal treatment with a temperature of less than 500 degrees celsius (° C.), while the voltage is applied to the electrodes 108 and the magnetic field generator generates a magnetic field that is perpendicular to the substrate 100. The magnetic field may also be applied by any means including a permanent magnet.

In this embodiment, the magnetic field is applied to the direction of moving the catalytic metal clusters 108 in order to accelerate the movement of metal clusters 108. Therefore, both the electric field generated between the pair of electrodes 110 and the magnetic field generated from the magnetic field generator are applied to the amorphous silicon layer 104. During the thermal treatment with the applied magnetic field, since the ferromagnetic atoms may diffuse easily into the amorphous silicon layer 104, the crystallization temperature may be lowered rather than that without applying the magnetic field. The amorphous silicon layer 104 may be crystallized at a temperature of about 450 degrees celsius (C) because the magnetic field is applied to the amorphous silicon layer 104 including the catalytic metal clusters 108. As a result, the atoms of catalytic metal clusters may move easily into the amorphous silicon layer 104.

Figure 2C:
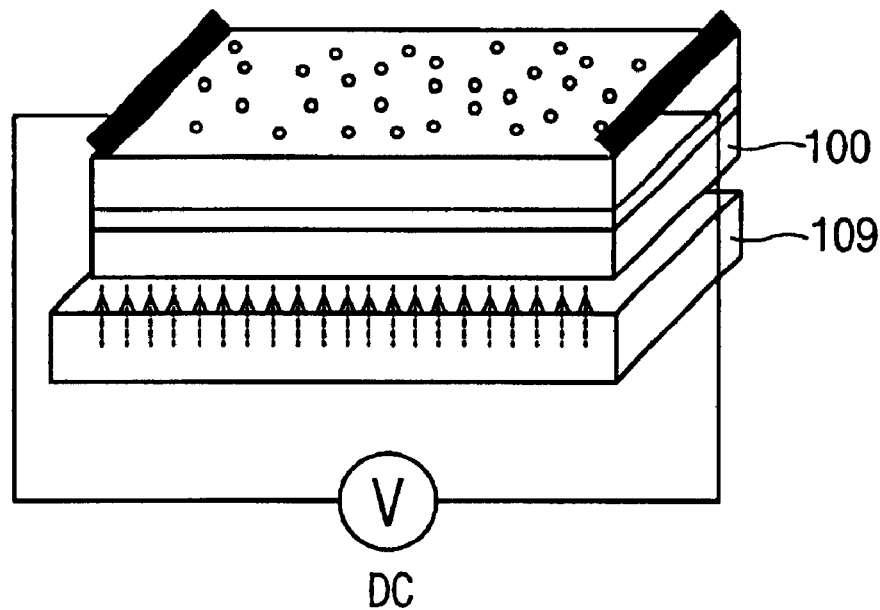
Figure 2D:
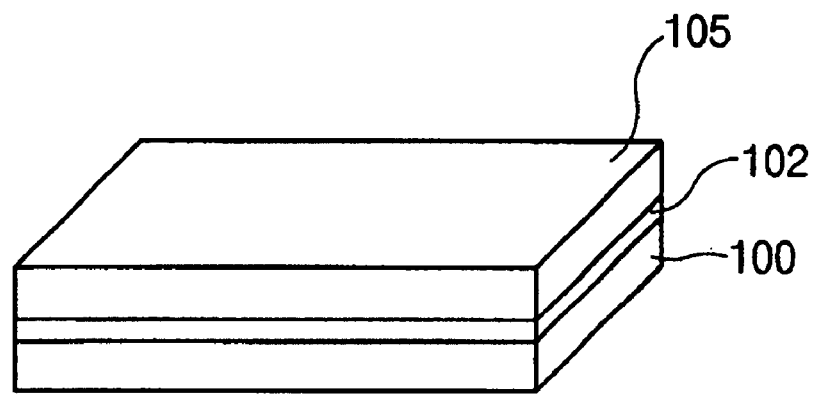

Now, referring to FIG. 2C, the magnetic field generator 109 may also be disposed below the substrate 100 as long as it facilitates the movement of the atoms of the catalytic metal clusters 108. Accordingly, a polycrystalline silicon layer 105, as shown in FIG. 2D, is formed on the buffer layer 102 after the above-mentioned processes.

Hereinafter, a method for fabricating a polycrystalline silicon thin film transistor will be explained in accordance to FIGS. 3A to 3F.

FIGS. 3A to 3F illustrate processes of forming a polycrystalline silicon TFT according to the present invention. In the present invention, the polycrystalline silicon TFT is a coplanar type TFT having a top gate structure as an example, and the FEMIC method mentioned before is applied to form the TFT.

Figure 3A:
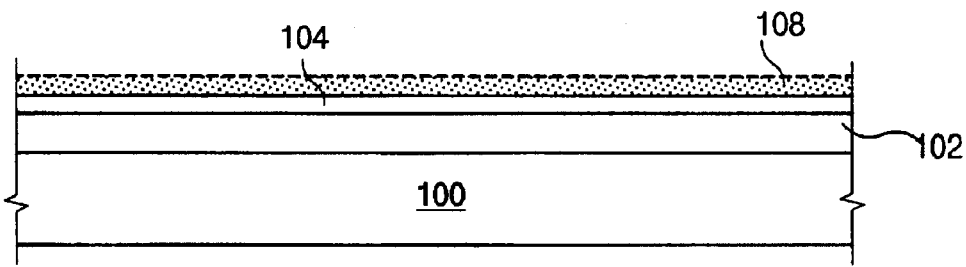
FIGS. 3A to 3F illustrate a process of forming a polycrystalline silicon TFT according to the present invention.

In FIG. 3A, a buffer layer 102 and an amorphous silicon layer 104 are sequentially deposited on a substrate 100. The buffer layer 102 made of silicon oxide is formed to protect the amorphous silicon layer 104 from alkali substances, which may be produced from the substrate 100 during later processes. After forming the amorphous silicon layer 104, catalytic metal clusters 108 are formed thereon by evaporating, sputtering or a metal solution. Nickel (Ni) may be selected for the metal catalyst 108. Paladium (Pd), iron (Fe), and cobalt (Co) may also be used as the catalytic metal clusters 108. The catalytic metal clusters 108 may be formed to have a density of about $5 \times 10^{13}$ to $1 \times 10^{19}/cm^2$.

Figure 3B:
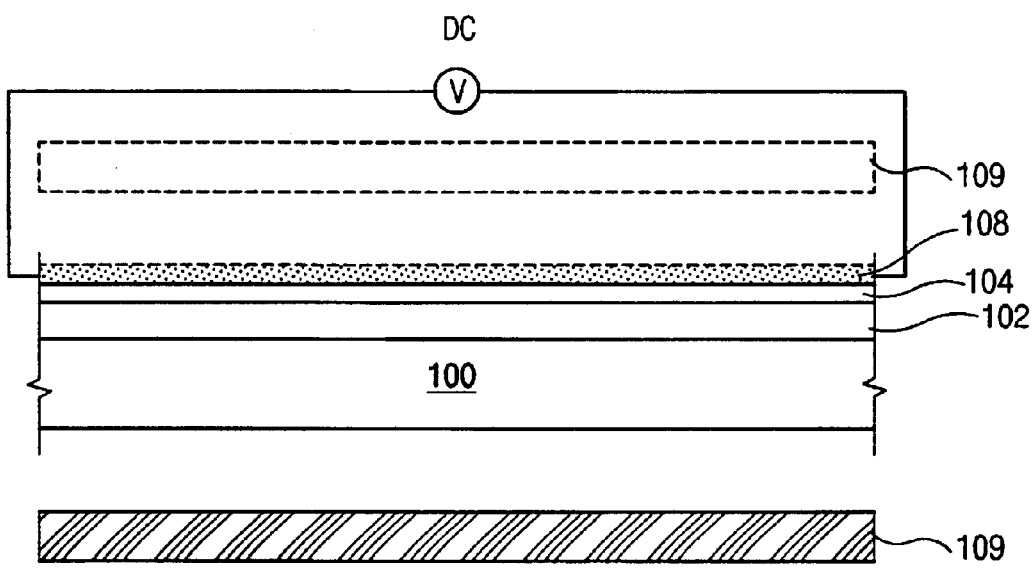

In FIG. 3B, a magnetic field generator 109 is disposed below or over the substrate 100 in order to generate a magnetic field perpendicular to the substrate 100. While the magnetic field generator 109 generates the magnetic field, a voltage (either DC or AC) may be applied to the catalytic metal clusters 108, thereby crystallizing the amorphous silicon layer 104 into a polycrystalline silicon layer. For example, a voltage of about 10 to 500 V/cm may be applied. In this process, the atoms of the catalytic metal clusters 108 may easily diffuse into the amorphous silicon layer 104 and act as catalysts for the amorphous silicon crystallization. Accordingly, due to the magnetic field accelerating the metal catalyst diffusion, a crystallization rate is enhanced and a crystallization temperature may be lowered.

Figure 3C:
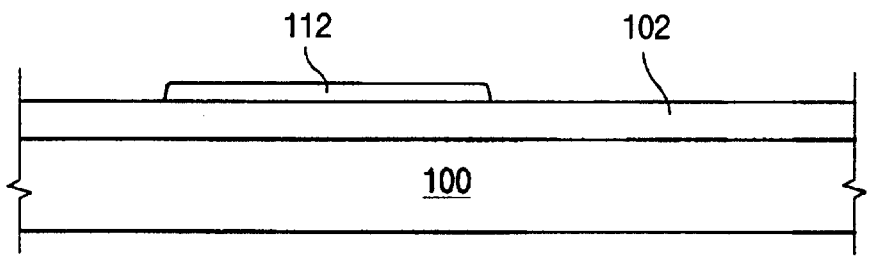

After the crystallization, the polycrystalline silicon (poly-Si) layer is patterned into a poly-Si island 112, as shown in FIG. 3C.

Figure 3D:
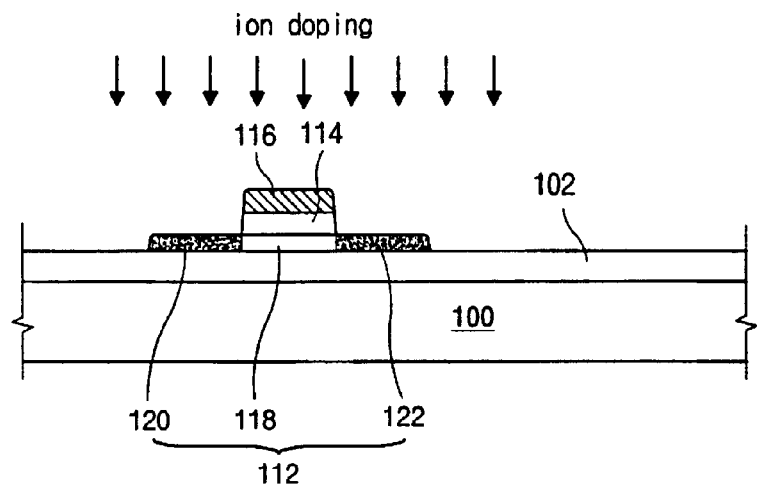

In FIG. 3D, a gate insulating layer 114 and a gate electrode 116 are sequentially formed on the poly-Si island 112. The gate insulating layer 114 may be formed of an organic or inorganic substance, while the gate electrode 116 may be formed of a metal selected from a group consisting of aluminum (Al), Al alloy, tungsten (W), copper (Cu), and molybdenum (Mo). Then, an ion doping injecting dopants is applied to the poly-Si island 112 using the gate electrode 116 as an ion stopper, thereby dividing the poly-Si island 112 into an active region 118, a source region 120, and a drain region 122. The active region 118 is a pure silicon region, whereas the source and drain regions 120 and 122 are doped silicon regions. The active region 118 is positioned on the buffer layer 102 between the source and drain regions 120 and 122. The gate insulating layer 114 and the gate electrode 116 are disposed on the active region 118.

Since the gate insulating layer 114 and the gate electrode 116 are patterned with the same mask in order to reduce the number of masks, they have the same shape. When the ion doping is applied to the poly-Si island 112, the gate electrode 116 serves as an ion stopper to prevent dopants from penetrating into the active region 118. After the ion doping is completed, the poly-Si island 112 possesses a specific electric characteristic, which varies with the types of a dopant. For example, if the dopant is $B_2H_6$ that includes a group III element, the doped portion of the poly-Si island 112 becomes a p-type semiconductor. Conversely, if the dopant is $PH_3$ that includes a group V element, the doped portion of the poly-Si island 112 becomes an n-type semiconductor. A proper dopant should be selected to satisfy the use of a device. After the ion doping is applied onto the poly-Si island 112, the dopant is activated.

Figure 3E:
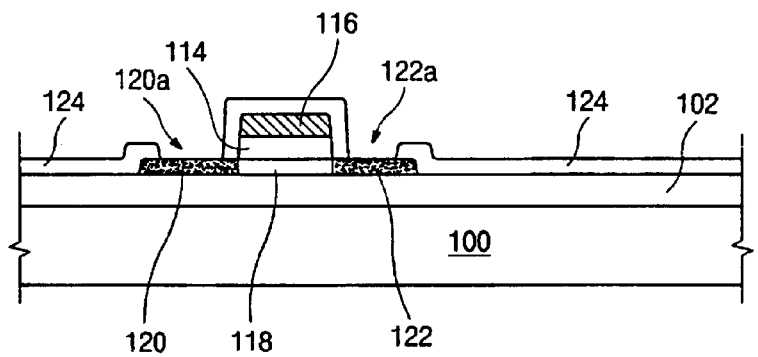

In FIG. 3E, an interlayer insulator 124 is formed to cover the gate electrode 116, the active region 118, and the source and drain regions 120 and 122. At this point, a source contact hole 120a and a drain contact hole 122a are formed passing through the interlayer insulator 124. Thus, the source and drain regions 120 and 122, are exposed by the source contact hole 120a and a drain contact hole 122b, respectively.

Figure 3F:
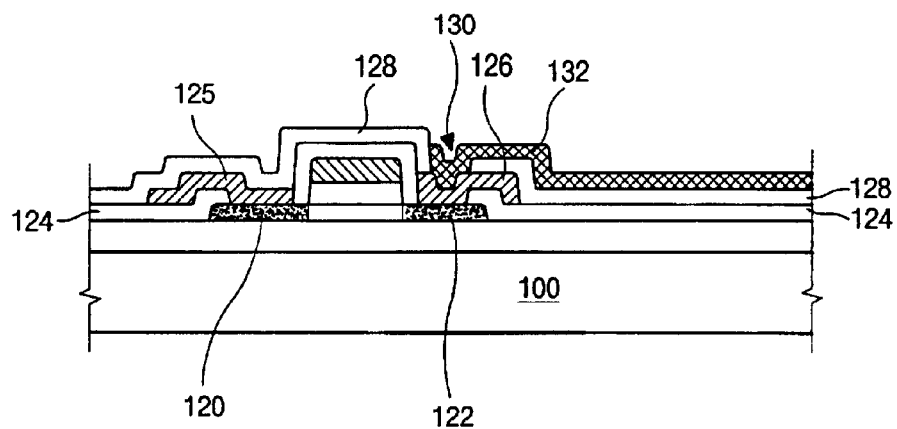

In FIG. 3F, a source electrode 125 and a drain electrode 126 are formed on the interlayer insulator 124. The source and drain electrodes 125 and 126 electrically contact the source and drain regions 120 and 122, respectively, through the source and drain contact holes 120a and 122a. Thereafter, a passivation layer 128 and a pixel electrode 132 are sequentially formed to cover the source and drain electrodes 125 and 126. The passivation layer 128 includes a pixel contact hole 130 that exposes a portion of the drain electrode 126. The pixel electrode 132 electrically contacts the drain electrode 126 through the pixel contact hole 130.

As described above, the polycrystalline silicon thin film transistor is completed by using the aforementioned fabrication processes according to the present invention. The present invention includes the following advantages.

Since the amorphous silicon layer is crystallized at a lower temperature, deterioration of the substrate is prevented.

In addition, the magnetic field is applied to the amorphous silicon layer including the catalytic metal clusters. Thus, the crystallization of the amorphous silicon layer is accelerated.

Furthermore, due to the fast crystallization and the low crystallization temperature, a manufacturing yield increases.

It will be apparent to those skilled in the art that various modifications and variations can be made in the method for fabricating a thin film transistor using a crystallized silicon layer of the present invention without departing from the spirit or scope of the inventions. Thus, it is intended that the present invention covers the modifications and variations of this invention provided they come within the scope of the appended claims and their equivalents.

What is claimed is:

1. A method of crystallizing amorphous silicon, comprising:
    forming an amorphous silicon layer over a substrate;
    forming a plurality of metal clusters on the amorphous silicon layer; and
    simultaneously applying a thermal treatment, an electric field, and a magnetic field to crystallize the amorphous silicon layer.

2. The method of claim 1, further comprising forming a buffer layer between the substrate and the amorphous silicon layer.

3. The method of claim 2, wherein the buffer layer is formed of silicon oxide ($SiO_2$).

4. The method of claim 1, wherein the thermal treatment is performed at a temperature of about 450 degrees celsius (°C.).

5. The method of claim 1, wherein the magnetic field is applied to a direction facilitating a movement of atoms of the metal clusters.

6. The method of claim 1, wherein the metal clusters are selected from a group consisting of nickel (Ni), paladium (Pd), iron (Fe), and cobalt (Co).

7. The method of claim 1, wherein the applied electric field is in the range of about 10 to 500 V/cm.

8. The method of claim 1, wherein the metal clusters have a density of about $5 \times 10^{13}$ to $1 \times 10^{19}/cm^2$.

9. The method of claim 1, wherein the metal clusters are formed by using one of evaporation, sputtering, and metal solution.

10. A method for forming a thin film transistor, comprising:
    forming a buffer layer on a substrate;
    forming an amorphous silicon layer on the buffer layer;
    forming a plurality of metal clusters on the amorphous silicon layer;
    simultaneously applying a thermal treatment, an electric field, and a magnetic field to crystallize the amorphous silicon layer into a polycrystalline silicon layer;
    patterning the polycrystalline silicon layer to form an island shape;
    forming a gate insulating layer on the island-shaped polycrystalline silicon layer;
    forming a gate electrode on the gate insulation layer;
    forming an active region, a source region, and a drain region in the island-shaped polycrystalline silicon layer;
    forming an interlayer insulating layer on the gate electrode and the island-shaped polycrystalline silicon layer including the buffer layer;
    patterning the interlayer insulating layer to form a source contact hole at the source region and a drain contact hole at the drain region; and simultaneously forming a source electrode contacting the source region through the source contact hole and a drain electrode contacting the drain region through the drain contact hole.

11. The method of claim 10, wherein the forming an active region, a source region, and a drain region is performed by injecting dopants into the island-shaped polycrystalline silicon layer.

12. The method of claim 11, wherein dopants include either a group III element or a group V element.

13. The method of claim 10, wherein the metal clusters are selected from a group consisting of nickel (Ni), paladium (Pd), iron (Fe), and cobalt (Co).

14. The method of claim 10, wherein the buffer layer is formed of silicon oxide ($SiO_2$).

15. The method of claim 10, wherein the thermal treatment is performed at a temperature of about 450 degrees celsius (°C.).

16. The method of claim 10, wherein the magnetic field is applied to a direction facilitating a movement of atoms of the metal clusters.

17. The method of claim 10, wherein the applied electric field is in the range of about 10 to 500 V/cm.

18. The method of claim 10, wherein the metal clusters have a density of about $5\times10^{13}$ to $1\times10^{19}/cm^2$.

19. The method of claim 10, wherein the metal clusters are formed by using one of evaporation, sputtering, and metal solution.

* * * * *